United States Patent
Imai (10) Patent No.: US 7,467,468 B2
(45) Date of Patent: Dec. 23, 2008

(54) METHOD FOR MANUFACTURING AN INK-JET HEAD

(75) Inventor: Koji Imai, Inuyama (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 498 days.

(21) Appl. No.: 11/092,049

(22) Filed: Mar. 29, 2005

(65) Prior Publication Data

US 2005/0212858 A1    Sep. 29, 2005

(30) Foreign Application Priority Data

Mar. 29, 2004   (JP)   ............................. 2004-095863

(51) Int. Cl.
  B21D 53/76   (2006.01)
  B23K 35/04   (2006.01)

(52) U.S. Cl. .................... 29/890.1; 29/840; 29/860; 29/852; 228/180.22; 228/246; 438/612; 347/50; 347/57; 708/446

(58) Field of Classification Search .............. 29/890.1, 29/840, 860, 852; 228/179.1, 180.1, 180.22, 228/245, 246; 347/50, 57; 438/612, 613, 438/614; 708/200, 446
See application file for complete search history.

(56) References Cited

U.S. PATENT DOCUMENTS

| | | | | |
|---|---|---|---|---|
| 5,519,936 A | * | 5/1996 | Andros et al. ................ | 29/840 |
| 6,140,707 A | * | 10/2000 | Plepys et al. ............ | 438/612 X |
| 6,374,487 B1 | * | 4/2002 | Haba et al. .................... | 29/840 |
| 6,508,536 B1 | * | 1/2003 | Beerling et al. ........ | 29/890.1 X |
| 2003/0156157 A1 | | 8/2003 | Suzuki et al. | |

FOREIGN PATENT DOCUMENTS

| | | | | |
|---|---|---|---|---|
| JP | 5-104711 | * | 4/1993 | ............... 29/890.1 |
| JP | 11-251353 | | 9/1999 | |
| JP | 2003-311953 | | 11/2003 | |

* cited by examiner

Primary Examiner—A. Dexter Tugbang
(74) Attorney, Agent, or Firm—Reed Smith LLP (57) ABSTRACT

A method for manufacturing an ink-jet head includes the step of forming, in a substrate, through holes respectively corresponding to conductors on one face of the substrate and each having its diameter increasing from the one face toward the other face of the substrate. Here, the through holes are formed in such a manner as to satisfy $R > d/2 + t/\tan\theta$, where: d represents a width of an opening of the through hole on the one face; $\theta$ represents an angle of inclination of a sidewall defining the through hole with respect to the one face; R represents a shortest distance from the center of the through hole to a periphery of an electrode that neighbors an electrode corresponding to the through hole; and t represents a thickness of the substrate.

3 Claims, 11 Drawing Sheets

METHOD FOR MANUFACTURING AN INK-JET HEAD

BACKGROUND OF THE INVENTION

1. Field of the Invention

The present invention relates to a method for manufacturing an ink-jet head that ejects ink to a record medium.

2. Description of Related Art

Japanese Patent Unexamined Publication No. 11-251353 discloses a semiconductor device that includes a flexible circuit board and an IC chip. The flexible circuit board has a polyimide, which is an insulating member, and a copper foil formed in a circuit pattern on the polyimide. The IC chip is mounted on a face of the flexible circuit board having the copper foil thereon so as to be electrically connected to the copper foil. In this semiconductor device, the polyimide of the flexible circuit board has through holes. Portions of the copper foil exposed through the through holes constitute electrode parts of the semiconductor device. The through hole has a tapered shape whose diameter is increasing from the face on which the copper foil is formed toward an opposite face. When, in this state where the through hole has a tapered shape, a solder ball is disposed within the through hole so that an electrode part of the semiconductor device is connected via the solder ball to an electrode part of a mother board, the solder ball obtains improved crack resistance because thermal stress caused by difference in thermal expansion coefficient between the semiconductor device and the mother board does not so much concentrate on the solder ball.

However, the aforesaid patent document does not mention the relationship between the taper angle of the through hole and the thickness of the polyimide in which the through hole is formed. Therefore, when the polyimide in which the through hole is formed has a relatively large thickness or when the through holes are formed at a high density in order to realize a high-resolution printing, openings of neighboring through holes on a face of the polyimide opposite to the face on which the copper foil is formed may interfere with or become so close to each other. If the openings of the through holes interfere with or become so close to each other, a solder ball disposed in a through hole may adhere to an uncorresponding electrode part of the mother board, e.g., an electrode part neighboring a corresponding electrode part, or solder balls come in contact with each other, to thereby cause a short circuit between electrode parts.

In an ink-jet head used in an ink-jet printer, etc., ink supplied from an ink tank is distributed to a plurality of pressure chambers and pulse pressure is selectively applied to the respective pressure chambers to thereby eject ink from nozzles. As a means for selectively applying pressure to the pressure chambers, an actuator unit having laminated ceramic piezoelectric sheets may be used.

As an example of such actuator unit, known is an actuator unit in which a plurality of laminated piezoelectric sheets extending over many pressure chambers are sandwiched between a common electrode extending over a plurality of pressure chambers and individual electrodes corresponding to the respective pressure chambers (see U.S. Patent Application No. 2003156157). When a drive voltage is supplied from a flexible printed circuit (FPC) to an individual electrode that is electrically connected to the FPC so that the potential of the individual electrode is differentiated from that of the common electrode, a portion of the piezoelectric sheets sandwiched between the individual electrode and the common electrode to be polarized in their thickness direction expands and contracts in their thickness direction by a piezoelectric effect. Thereby, the volume of the corresponding pressure chamber is changed, and ink can be ejected from a nozzle communicating with the pressure chamber toward a record medium. When this type of ink-jet head adopts the technique disclosed in the aforementioned Japanese Patent Unexamined Publication No. 11-251353 in order to bond the individual electrodes and the FPC, a short circuit between individual electrodes may similarly be caused.

SUMMARY OF THE INVENTION

An object of the present invention is to provide a method for manufacturing an ink-jet head that can effectively prevent a short circuit between electrodes.

According to a first aspect of the present invention, there is provided a method for manufacturing an ink-jet head comprising the steps of: forming a plurality of conductors on one face of a substrate; forming, in the substrate, a plurality of through holes corresponding to the plurality of conductors, respectively, and each having its diameter increasing from the one face toward the other face that is parallel to the one face; attaching, from the other face, metal balls to the conductors that are exposed outside via the through holes; and heating and thus melting the metal balls, so that the conductors are bonded, through the melted balls, to a plurality of electrodes, respectively, that are formed in correspondence with the respective conductors along a plane parallel to the one face of the substrate. In the step of forming the plurality of through holes, the through holes are formed in such a manner as to satisfy $R > d/2 + t/\tan\theta$, where: d represents a width of an opening of the through hole on the one face; $\theta$ represents an angle of inclination of a sidewall defining the through hole with respect to the one face; R represents a shortest distance from the center of the through hole to a periphery of an electrode that neighbors an electrode corresponding to the through hole; and t represents a thickness of the substrate.

In the foregoing method, the through holes are so formed as to satisfy the aforesaid formula. As a result, the metal ball disposed within the through hole to bond the electrode to the conductor can effectively be prevented from adhering to a uncorresponding land, e.g., to an electrode neighboring the corresponding electrode, and in addition contact between the metal balls can also be prevented effectively. Thus, a short circuit between the electrodes can effectively be prevented. This effect also works in an ink-jet head in which the through holes are formed at a high density to realize a high-resolution printing.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

In the following, a certain preferred embodiment of the present invention will be described with reference to the accompanying drawings.

Figure 1:
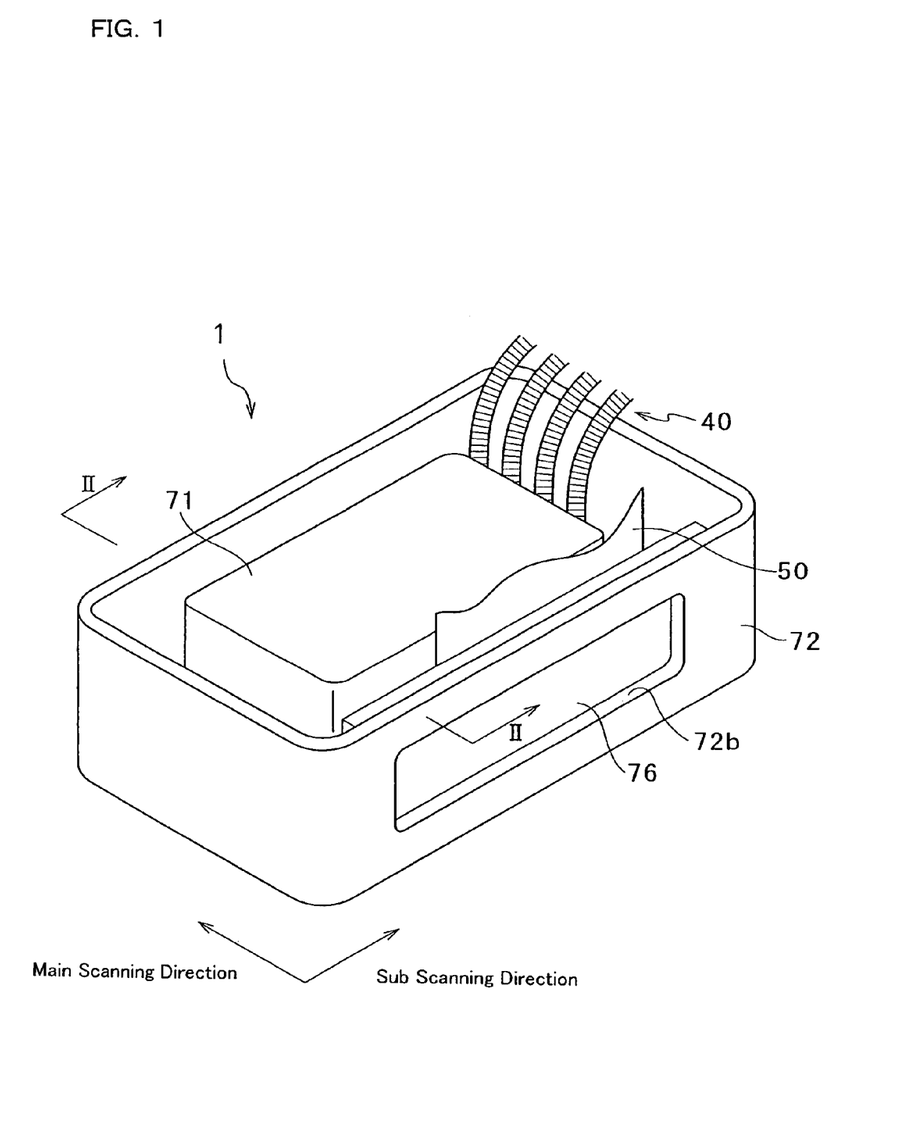
FIG. 1 is a perspective view of an ink-jet head according to an embodiment of the present invention.
Figure 2:
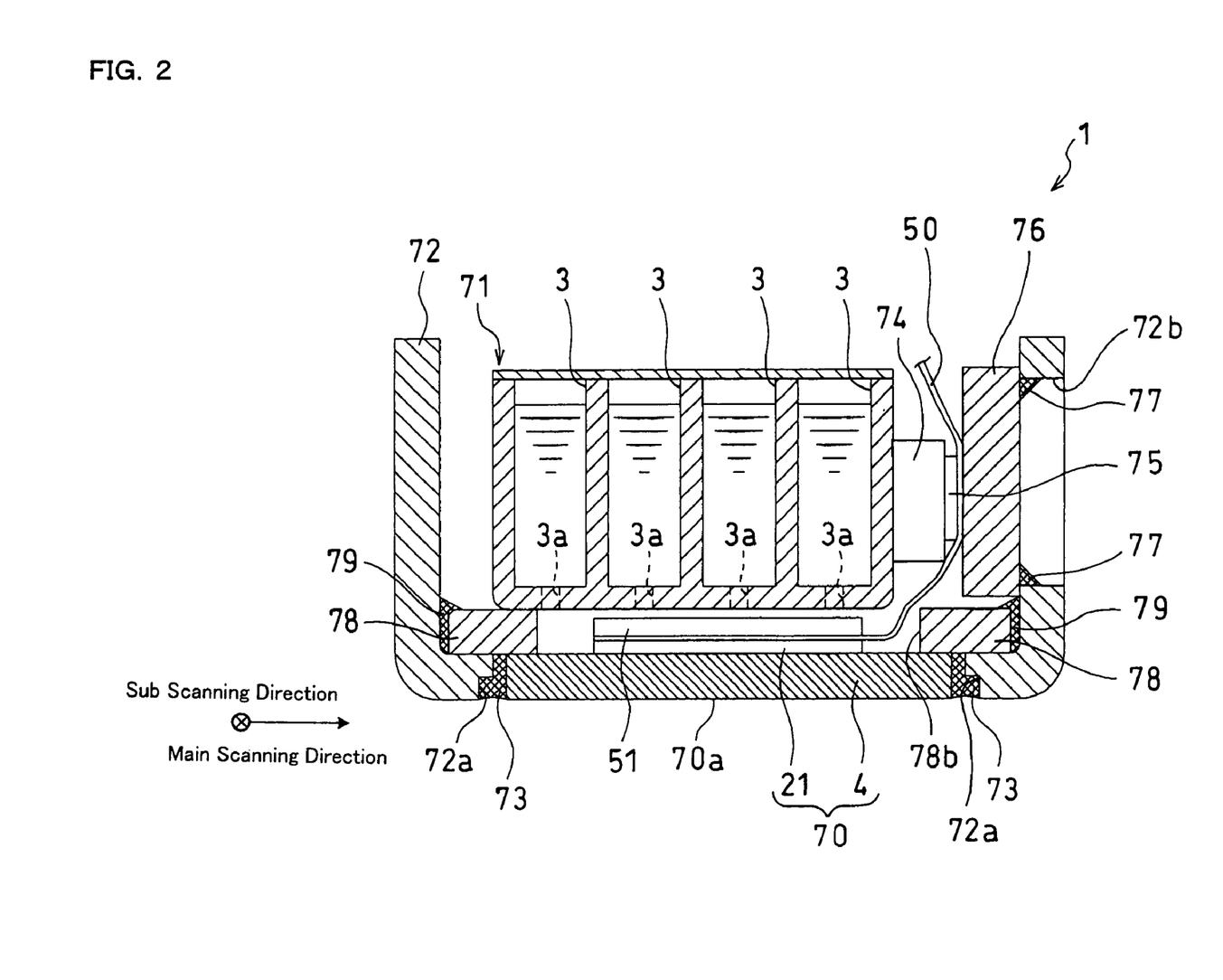
FIG. 2 shows a section taken along a line II-II of FIG. 1.

An ink-jet head of this embodiment is used in an ink-jet printer of serial type (not illustrated), and performs printing by ejecting ink of four colors, i.e., magenta, yellow, cyan, and black toward a paper that is conveyed on along a sub scanning direction. As illustrated in FIGS. 1 and 2, an ink-jet head 1 of this embodiment comprises an ink tank 71 in which formed are four ink chambers 3 that store ink of respective four colors, and a head main body 70 that is disposed below the ink tank 71.

Formed inside the ink tank 71 are the ink chambers 3 that stores ink of, from left to right in FIG. 2, magenta, yellow, cyan, and black, respectively. The ink chambers 3 are disposed along a main scanning direction. Each of the four ink chambers 3 is connected to a corresponding ink cartridge (not illustrated) via a tube 40 (see FIG. 1), so that ink of the respective colors is supplied from the ink cartridges to the ink chambers 3.

Figure 3:
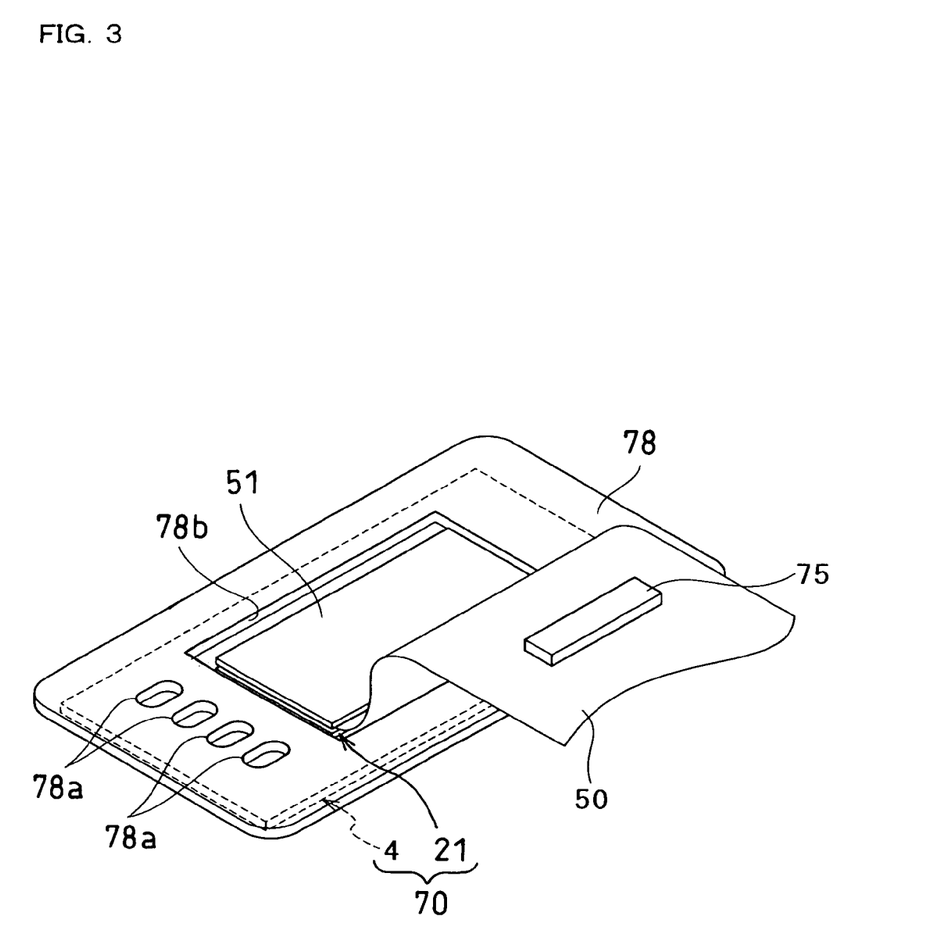
FIG. 3 is a perspective view of a reinforcement plate shown in FIG. 2 and a head main body fixed to the reinforcement plate.

The ink tank 71 is housed in a holder 72 having a hollow, substantially rectangular parallelepiped shape with its top face being opened. As illustrated in FIG. 2, the ink tank 71 is disposed on the reinforcement plate 78. A bottom wall of the holder 72 has an opening 72a. A step is formed in a wall that defines the opening 72a. The reinforcement plate 78 is disposed in such a manner as to close the opening 72a, and fixed onto the bottom wall of the holder 72 with an ultraviolet curing agent 79. As illustrated in FIG. 3, the reinforcement plate 78 has a substantially rectangular shape, and has four through holes 78a of elliptic shape. Four ink outlet ports 3a are formed in a bottom wall of the ink tank 71 (see FIG. 2). The ink tank 71 is disposed on the reinforcement plate 78 such that the four ink outlet ports 3a may correspond to the respective four through holes 78a formed in the reinforcement plate 78.

The head main body 70 illustrated in FIGS. 2 and 3 includes a passage unit 4 and an actuator unit 21. In the passage unit 4, a plurality of ink passages corresponding to the respective ink colors, which will be referred to as manifold channels 5M, 5Y, 5C, and 5K, are formed. The actuator unit 21 is bonded onto an upper face of the passage unit 4 with an epoxy-base thermosetting adhesive. Each of the passage unit 4 and the actuator unit 21 are constituted of a plurality of thin plates that are put in layers and bonded to one another.

As illustrated in FIG. 2, the passage unit 4 is disposed within the opening 72a of the holder 72, and a space between the passage unit 4 and the wall defining the opening 72a is sealed with a sealing material 73. As illustrated in FIGS. 2 and 3, the actuator unit 21 is disposed within a substantially rectangular through hole 78b that is formed substantially at the center of the reinforcement plate 78.

Figure 4:
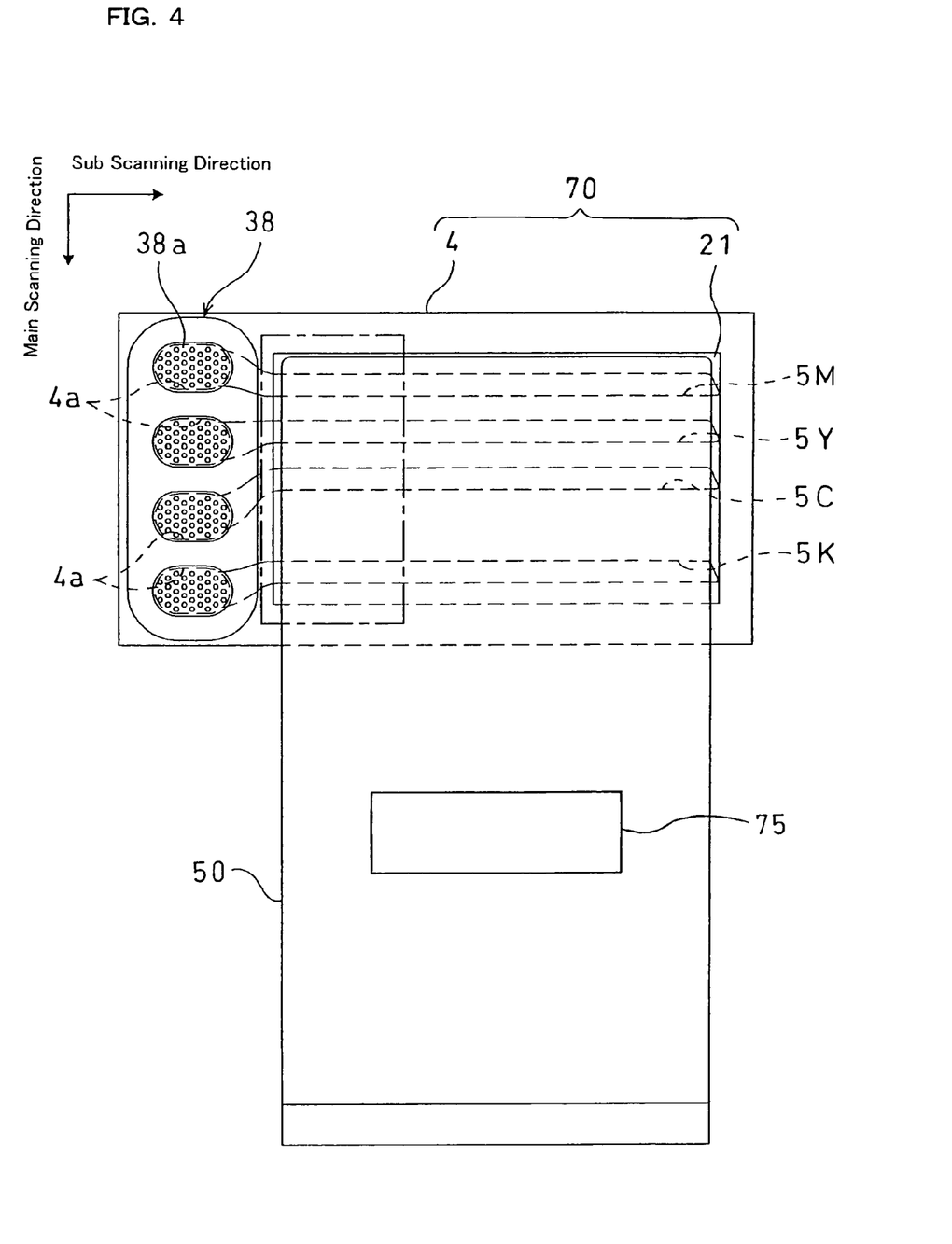
FIG. 4 is a plan view of the head main body.

As illustrated in FIG. 4, four ink supply ports 4a of elliptic shape are formed on the upper face of the passage unit 4. The passage unit 4 is fixed to a lower face of the reinforcement plate 78 such that the four ink supply ports 4a may correspond to the respective four through holes 78a (see FIG. 3) formed in the reinforcement plate 78. Referring to FIG. 2, ink contained in the four ink chambers 3 flows through the ink outlet ports 3a formed in the bottom wall of the ink tank 71 and through the through holes 78a formed in the reinforcement plate 78 (see FIG. 3), and then supplied through the corresponding ink supply ports 4a of the passage unit (see FIG. 4) into the passage unit 4. A lower face of the passage unit 4 serves as an ink ejection face 70a (see FIG. 2) having a later-described ink ejection region which is exposed to outside.

A flexible printed circuit (FPC) 50 as a power supply member is bonded to an upper face of the actuator unit 21. A protective plate 51 (see FIGS. 2 and 3) that protects the FPC 50 and the actuator unit 21 is put on a region of the upper face of the FPC bonded to the actuator unit 21. One end of the FPC 50 is bonded to the actuator unit 21, and the other end thereof is extended out from one side of the main scanning direction and extended upward with its portion halfway being bent.

As illustrated in FIGS. 1 and 2, a rectangular opening 72b is formed in one sidewall of the holder 72. A heat sink 76 made of an aluminium plate having a substantially rectangular parallelepiped shape is fixed to an inner face of the one sidewall of the holder 72 so that the heat sink 76 can close the opening 72b. As illustrated in FIG. 2, an elastic member 74 such as a sponge is fixed to a portion of a sidewall of the ink tank 71 confronting the heat sink 76. Further, a driver IC 75 is fixed to the elastic member 74, and thereby the FPC 50 is sandwiched between the driver IC 75 and the heat sink 76. The elastic member 74 presses the driver IC 75 to the heat sink 76 with the FPC 50 being sandwiched between the driver IC 75 and the heat sink 76. The FPC 50 is electrically connected to the driver IC 75 by soldering so that it can transmit to the actuator unit 21 a drive signal outputted from the driver IC 75. The heat sink 76 and the opening 72b allow heat generated in the driver IC 75 to be efficiently dissipated.

On a wall that defines the opening 72b formed in the one sidewall of the holder 72, a sealing material 77 is put near the heat sink 76 in order to prevent dust or ink from entering the head main body 70.

As illustrated in FIG. 4, the passage unit 4 has a rectangular plane elongated in the sub scanning direction. In the passage unit 4, four manifold channels 5M, 5Y, 5C, and 5K extending in the sub scanning direction in parallel with each other are formed. Magenta ink, yellow ink, cyan ink, and black ink are supplied from the ink changers 3 of the ink tank 71 through the four ink supply ports 4a of the passage unit 4 into the manifold channels 5M, 5Y, 5C, and 5K, respectively. The three manifold channels 5M, 5Y, and 5C are disposed at a regular interval in a widthwise direction of the passage unit 4, i.e., in the main scanning direction. The manifold channel 5K is disposed away from the manifold channel 5C with a distance therebetween being larger than the interval at which the three manifold channels 5M, 5Y, and 5C are disposed in the main scanning direction.

A filter member 38 is disposed at a position of the upper face of the passage unit 4 which covers the four ink supply ports 4a. The filter member 38 has, at its portions confronting the four ink supply ports 4a, four filters 38a each having a plurality of small pores. The filters 38a of the filter member 38 catch foreign materials such as dust that may be contained in ink having supplied from the ink tank 71 to the passage unit 4, thereby preventing the foreign materials from entering the manifold channels 5M, 5Y, 5C, and 5K.

Figure 5:
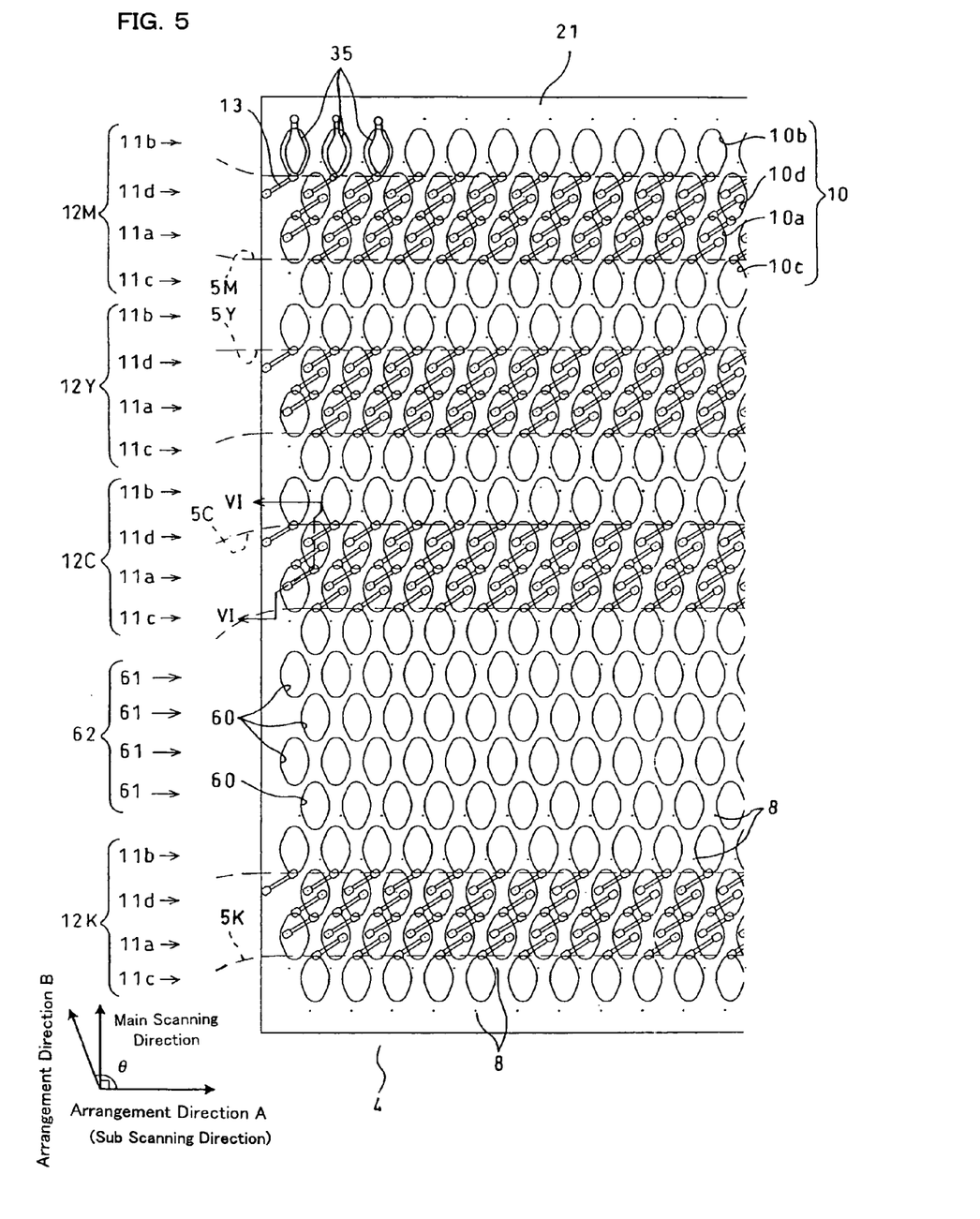
FIG. 5 is an enlarged view of a region enclosed with an alternate long and short dash line in FIG. 4.

As illustrated in FIG. 4, the actuator unit 21 has a rectangular plane elongated in the sub scanning direction, and is bonded to the upper face of the passage unit 4 such that the actuator unit 21 may be disposed substantially at the center of an area on the upper face neighboring the filter member 38. As illustrated in FIG. 5, in a region of the upper face of the passage unit 4 to which the actuator unit 21 is bonded, a large number of pressure chambers 10 and cavities 60 are arranged in a matrix in an arrangement direction A, i.e., in the sub scanning direction, and in an arrangement direction B, i.e., in a direction forming an obtuse angle θ with the arrangement direction A. A region of the lower face of the passage unit 4 corresponding to an area where the actuator unit 21 is bonded serves as an ink ejection region in which a large number of small-diameter nozzles 8 (see FIG. 6) are formed in a matrix in the similar manner. In FIG. 5, to facilitate understanding of the drawings, pressure chambers 10, apertures 13, i.e., constrictions, and nozzles 8 are illustrated with solid lines though they are within the passage unit 4 and therefore should be illustrated with broken lines.

Figure 6:
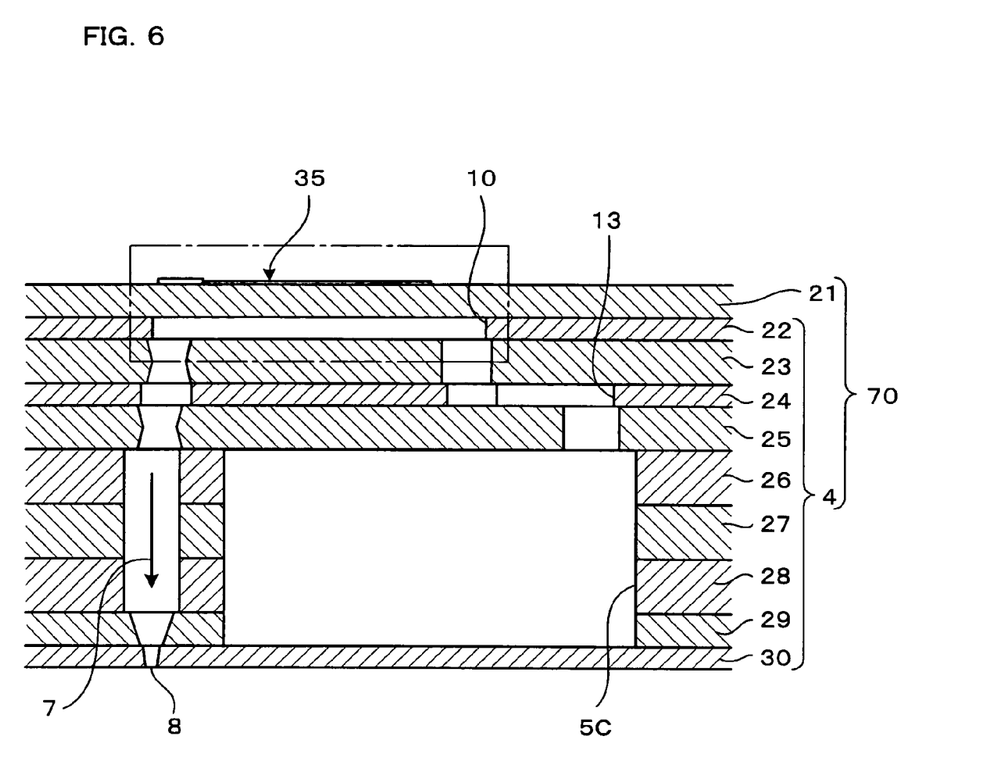
FIG. 6 shows a section taken along a line VI-VI of FIG. 5.

As illustrated in FIG. 6, one end of the pressure chamber 10 communicates with the nozzle 8, and the other end thereof communicates via an aperture 13 with the manifold channel (the manifold channel 5C is shown in FIG. 6). That is, one individual ink passage 7 extending from one of the manifold channels 5M, 5Y, 5C, and 5K through an aperture 13 to a nozzle 8 is formed for every pressure chamber 10. To be more specific, the individual ink passage 7 extends upward from the manifold channel 5M, 5Y, 5C, or 5K, then extends horizontally in the aperture 13, then further extends upward, then again extends horizontally in the pressure chamber 10, then extends obliquely downward in a certain length to get apart from the aperture 13, and then extends vertically downward toward the nozzle 8.

As clearly shown in FIG. 6, the pressure chamber 10 and the aperture 13 are disposed at different levels with respect to the thickness direction of the passage unit 4. This enables an aperture 13 communicating with a certain pressure chamber 10 to be, in a plan view, so disposed as to overlap another pressure chamber neighboring the aforesaid certain pressure chamber 10, as illustrated in FIG. 5. Accordingly, a large number of pressure chambers 10 can be arranged at a high density, and therefore the ink-jet head 1 is capable of a high-resolution printing while occupying a relatively small area.

Referring to FIG. 6, the passage unit 4 has a layered structure laminated with nine sheet members in total, i.e., from the top, a cavity plate 22, a base plate 23, an aperture plate 24, a supply plate 25, manifold plates 26 to 29, and a nozzle plate 30. The cavity plate 22 is a metal plate in which many substantially rhombic openings to serve as the pressure chambers 10 and as the cavities 60 are formed in an area corresponding to an area where the actuator unit 21 is bonded. The base plate 23 is a metal plate in which both of one communication hole between a pressure chamber 10 and a corresponding aperture 13 and one communication hole between a pressure chamber 10 and a corresponding nozzle 8 are provided for each pressure chamber 10. The aperture plate 24 is a metal plate in which both of one opening to serve as an aperture 13 and a communication hole between a pressure chamber 10 and a corresponding nozzle 8 are provided for each pressure chamber 10. The supply plate 25 is a metal plate in which both of one communication hole between an aperture 13 and the manifold channel 5M, 5Y, 5C, or 5K and one communication hole between a pressure chamber 10 and a corresponding nozzle 8 are provided for each pressure chamber 10. Each of the manifold plates 26 to 29 is a metal plate in which, in addition to openings to serve as the manifold channels 5M, 5Y, 5c, and 5K, one communication hole between a pressure chamber 10 and a corresponding nozzle 8 is provided for each pressure chamber 10. The nozzle plate 30 is a metal plate in which one opening to serve as a nozzle 8 is provided for each pressure chamber 10. These nine plates 22 to 30 are positioned in layers with one another to form the individual ink passage 7.

Here will be described the pressure chamber 10 and the cavity 60 with reference to FIG. 5.

The pressure chamber 10 and the cavity 60 have the same planar shape and the same size. When no discrimination is put on them, they are arranged regularly in a predetermined pattern. All the pressure chambers 10 and the cavities 60 are covered with the actuator unit 21.

In a plan view, each of the pressure chambers 10 and the cavities 60 has a substantially rhombic shape with its corners rounded. Its longer diagonal is parallel to the main scanning direction, and its shorter diagonal is parallel to the sub scanning direction. Each pressure chamber 10 communicates with the nozzle 8 at one end of the longer diagonal, and communicates via the aperture 13 with the manifold channel 5M, 5Y, 5C, or 5K at the other end thereof.

The pressure chambers 10 constitute four groups of pressure chamber rows 12M, 12Y, 12C, and 12K which correspond to the four ink colors, respectively. The groups of pressure chamber rows 12M, 12Y, 12C, and 12K correspond to the manifold channels 5M, 5Y, 5C, and 5K, respectively. Each of the groups of pressure chamber rows 12M, 12Y, 12C, and 12K includes four pressure chamber rows 11a, 11b, 11c, and 11d that extend along the arrangement direction A shown in FIG. 5. The pressure chamber rows are, depending upon their positional relationships with the manifold channels 5M, 5Y, 5C, and 5K, classified into a first pressure chamber row 11a, a second pressure chamber row 11b, a third pressure chamber row 11c, and a fourth pressure chamber row 11d. The first to fourth pressure chamber rows 11a to 11d, which are provided for each of the manifold channel 5M, 5Y, 5C, and 5K, are disposed adjacent to one another in the main scanning direction in an order of 11c, 11a, 11d, and 11b from the lower side to the upper side of the drawing sheet of FIG. 5.

In FIG. 5, the nozzles 8 that communicate with the pressure chambers 10a included in the first pressure chamber row 11a and the nozzles 8 that communicate with the pressure chambers 10c included in the third pressure chamber raw 11c are located on lower-left sides of their corresponding pressure chambers 10a and 10c. In FIG. 5, the nozzles 8 that communicate with the pressure chambers 10b included in the second pressure chamber row 11b and the nozzles 8 that communicate with the pressure chambers 10d included in the fourth pressure chamber raw 11d are located on lower-right sides of their corresponding pressure chambers 10b and 10d. The pressure chambers 10a included in the first pressure chamber rows 11a and the pressure chambers 10d included in the fourth pressure chamber rows 11d overlap, in more than half the area thereof, with the manifold channels 5M, 5Y, 5C, and 5K. The pressure chambers 10b included in the second pressure chamber row 11b and the pressure chambers 10c included in the third pressure chamber row 11c do, in substantially the whole area thereof, not overlap with the manifold channels 5M, 5Y, 5C, and 5K. With this construction, the manifold channels 5M, 5Y, 5C, and 5K can be increased in width as much as possible for the purpose of smooth ink supply to the respective pressure chambers 10, while preventing the nozzles 8 communicating with the pressure chambers 10 from overlapping with the manifold channels 5M, 5Y, 5C, and 5K.

The cavities 60 constitute one group of cavity rows 62 that includes four cavity rows 61 extending along the arrangement direction A. The four cavity rows 61 constituting the group of cavity rows 62 are disposed adjacent to one another in the main scanning direction. The group of cavity rows 62 locates between the groups of pressure chamber rows 12C and 12K.

Unlike the pressure chambers 10, the cavities 60 do not communicate with the nozzles 8 nor with the manifold channels 5M, 5Y, 5C, and 5K, and therefore are not filled with ink.

Within the actuator unit 21, sixteen pressure chambers 10 in which four cavities 60 are sandwiched are arranged in the arrangement direction B, and eight pressure chambers 10 in which two cavities 60 are sandwiched are arranged in the main scanning direction.

In the arrangement direction A, the pressure chambers 10 are arranged at an interval corresponding to a printing resolution. In this embodiment, in order to perform printings at a resolution of 150 dpi, the pressure chambers 10 are arranged in the arrangement direction A at an interval corresponding to 37.5 dpi.

The actuator unit 21 will next be described.

As illustrated in FIG. 6, the actuator unit 21 is bonded to the upper face of the passage unit 4, i.e., to a surface of the cavity plate 22, so that it defines the pressure chambers 10. On the actuator unit 21, individual electrodes 35 are formed at positions opposed to the respective pressure chambers 10. Each of the individual electrodes 35 has a substantially rhombic shape that is, in a plan view, substantially the same as the shape of the pressure chamber 10 and is somewhat smaller than the pressure chamber 10 (see FIG. 7B). Although FIG. 5 illustrates only some of the individual electrodes 35 for the simplification purpose, a large number of individual electrodes 35 are arranged in a matrix which is the same pattern as of the pressure chambers 10. When, like this, many pressure chambers 10 and many individual electrodes 35 are arranged in a regular pattern, designing becomes easier.

Figure 7A:
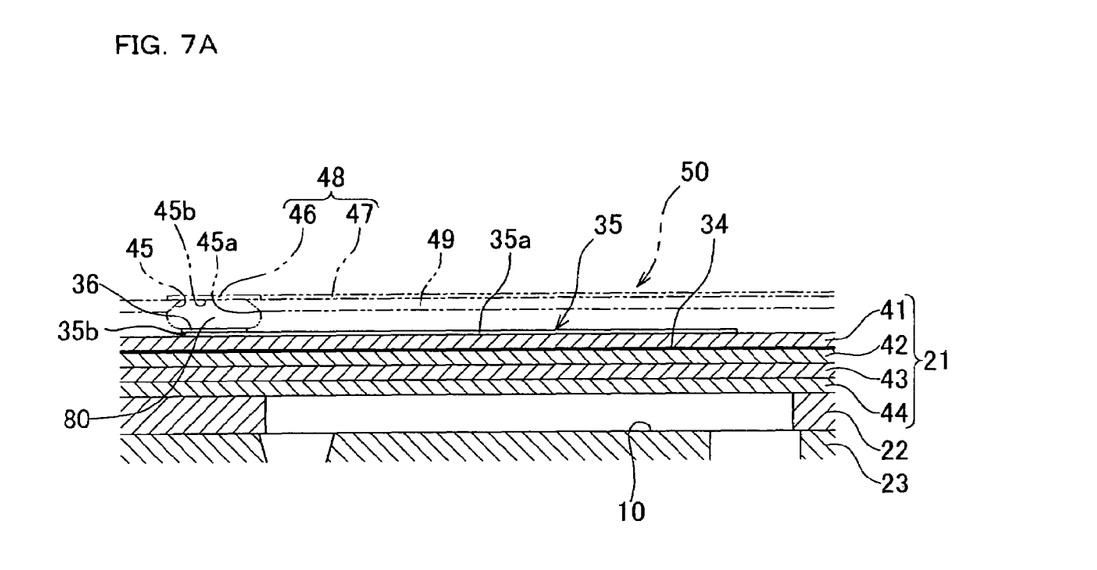
FIG. 7A shows an actuator unit and is an enlarged view of a portion enclosed with an alternate long and short dash line in FIG. 6.

As illustrated in FIG. 7A, the actuator unit 21 includes four laminated piezoelectric sheets 41, 42, 43, and 44. Each of the piezoelectric sheets 41 to 44 has a thickness of approximately 15 μm, and is made of a lead zirconate titanate (PZT)-base ceramic material having ferroelectricity.

These piezoelectric sheets 41 to 44 are disposed to cover all the pressure chambers 10 that are formed in a matrix in the passage unit 4. This allows the individual electrodes 35 to be arranged at a high density by using, e.g., a screen-printing technique. In addition, the pressure chambers 10, which are formed at positions corresponding to the individual electrodes 35, can also be arranged at a high density, thereby enabling high-resolution printings.

Figure 7B:
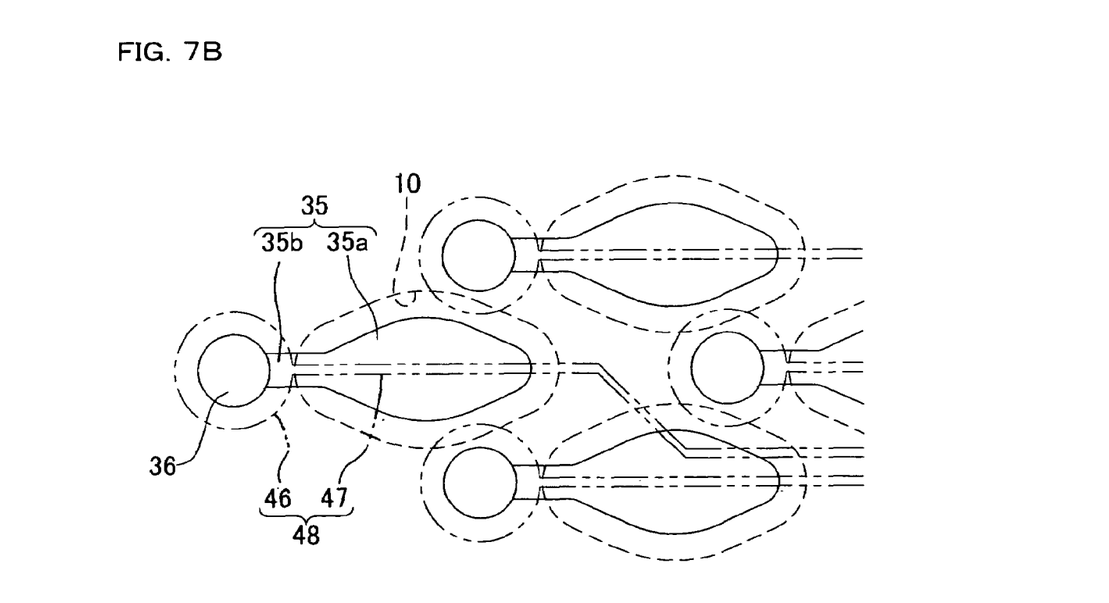
FIG. 7B is a plan view of individual electrodes that are included in the actuator unit.
Figure 8:
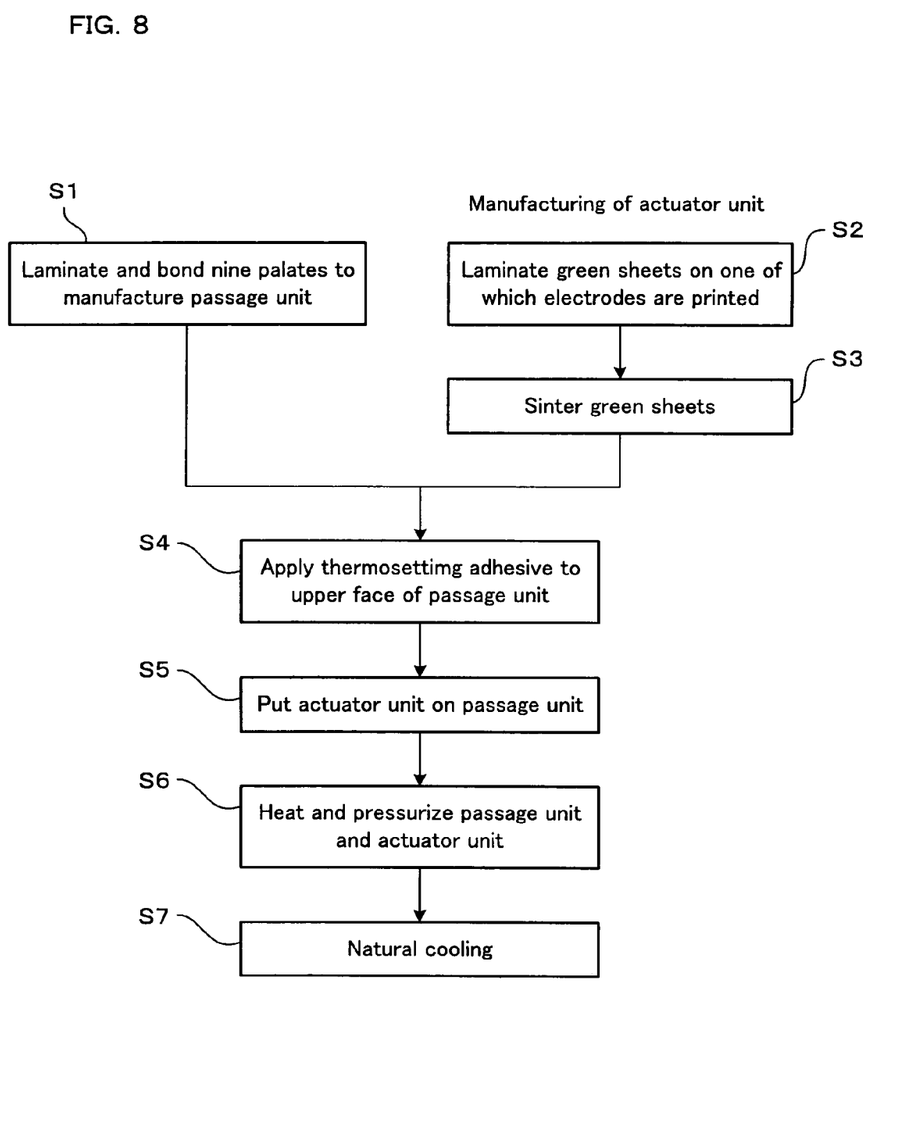
FIG. 8 shows a part of a flowchart of a manufacturing process of the ink-jet head.
Figure 9:
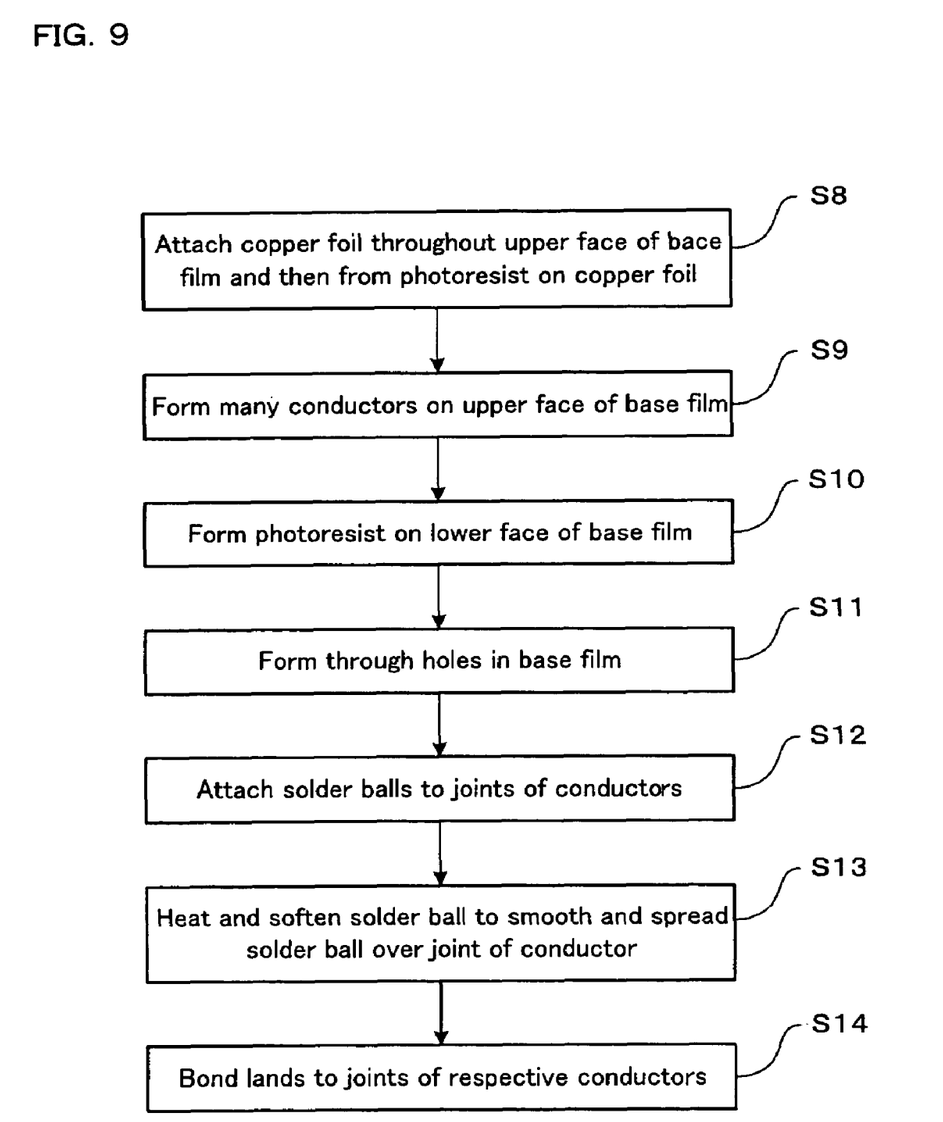
FIG. 9 shows a flowchart of a manufacturing process of the ink-jet head which follows the process shown in FIG. 8.

The individual electrode 35 formed on the uppermost piezoelectric sheet 41 includes a main electrode region 35a and an auxiliary electrode region 35b, as shown in FIG. 7B. The main electrode region 35a locates within the pressure chamber 10 in a plan view. The auxiliary electrode region 35b is connected with the main electrode region 35a and locates out of the pressure chamber 10 in a plan view. The main electrode region 35a has a substantially rhombic shape that is, in a plan view, substantially the same as the shape of the pressure chamber 10 and is somewhat smaller than the pressure chamber 10. The main electrode region 35a has its one acute corner (which is the left corner in FIG. 7B) is extended out to form the auxiliary electrode region 35b. A circular land 36 is provided at an end of the auxiliary electrode region 35b. The land 36 is electrically connected with the individual electrode 35. The land 36 is made of, e.g., gold including glass frits, and has a diameter of approximately 0.3 mm. The land 36 is opposed to a region of the passage unit 4 in which no actuator unit 10 is formed, and formed on a surface of the auxiliary electrode region 35b, as shown in FIG. 7A.

A common electrode 34 is disposed between the uppermost piezoelectric sheet 41 and the piezoelectric sheet 42 located thereunder. The common electrode 34 has the same shape as that of the piezoelectric sheet 41, and has a thickness of approximately 2 μm. In a non-illustrated region, the common electrode 34 is grounded. The common electrode 34 is, throughout its region corresponding to all the pressure chambers 10, kept equally at a constant potential which in this embodiment is a ground potential.

Both the individual electrodes 35 and the common electrode 34 are made of, e.g., an Ag—Pd-base metallic material.

As illustrated in FIG. 7A, the FPC 50 includes a base film 49 and a plurality of conductors 48. The base film 49 is made of a polyimide-resin film having a thickness of approximately 38 μm. The plurality of conductors are formed in a matrix on the base film 49. The base film 49 may be made of a resin film of, e.g., polyethylene, polycarbonate, polystyrene, or polypropylene. The conductors 48 are made of a copper film.

In the base film 49, tapered through holes 45, each of which has its diameter increasing downward, are formed at positions confronting the lands 36 of the individual electrodes 35. Thus, an opening 45a of the through hole 45 on a lower face of the base film 49 has a diameter and an area both larger than those of an opening 45b of the through hole 45 on an upper face of the base film 49.

As illustrated in FIGS. 7A and 7B, the conductor 48 includes a joint 46 and an extended-out part 47. The joint 46 is formed at a position confronting the land 36 of the individual electrode 35 so as to close the through hole 45 at a side of the upper face of the base film 49. The extended-out part 47 is extended out from the joint 46 toward an end of the FPC 50 so as to be connected to the driver IC 75. The conductors 48 form a predetermined pattern on the upper face of the base film 49. Many conductors 48, which are independent of one another, are provided on the base film 49 so that they may correspond to the respective pressure chambers 35. The joint 46 of each conductor 48 is jointed via a later-described solder ball 80 with the land 36 of a corresponding individual electrode 35. The individual electrodes 35 are connected to the driver IC 75 via the respective conductors 48 of the FPC which are independent of one another. Therefore, potential control can be exercised independently for each pressure chamber 10.

Next, a driving manner of the actuator unit 21 will be described.

The piezoelectric sheet 41 of the actuator unit 21 has been polarized in its thickness direction. The actuator unit 21 has a so-called unimorph structure in which an uppermost piezoelectric sheet 41 which is most distant from the pressure chambers 10 forms a layer including portions activated upon application of electric field (hereinafter referred to simply as a "layer including active portions"), and the other three piezoelectric sheets 42 to 44 near the pressure chambers 10 form inactive layers including no active portion. The three piezoelectric sheets 42 to 44 disposed under the piezoelectric sheet 41 are not influenced by the electric field, and therefore they are not deformed by themselves. This causes a difference in strain with respect to a direction of extension of the sheets between the piezoelectric sheets 41 and the piezoelectric sheets 42 to 44. As a result, the piezoelectric sheets 41 to 44 are as a whole going to deform downward into a convex shape (which is called a unimorph deformation). At this time, as shown in FIG. 7A, a lower face of the actuator unit 21 is fixed to the upper face of the cavity plate 22 to thereby define the pressure chambers. Therefore, the piezoelectric sheets 41 to 44 deform into the convex shape toward the pressure chamber 10. This reduces the volume of the pressure chamber 10, and thus pressure on ink contained in the pressure chamber 10 is raised, so that ink is ejected through the nozzle 8. Thereafter, when the individual electrode 35 is returned to the same potential as that of the common electrode 34, the piezoelectric sheets 41 to 44 restore their original shape, and the pressure chamber 10 also restores its original volume. At this time, ink is fed from the manifold channel 5M, 5Y, 5C, or 5K into the pressure chamber 10 which is thereby filled with ink again.

There may be adopted another driving manner in which the individual electrodes 35 and the common electrode 34 are in advance set at different potentials from each other, and the individual electrode 35 is set at the same potential as that of the common electrode 34 upon every ejection request, and then the individual electrode 35 is set at the potential different from that of the common electrode 34 at a predetermined timing. When this driving manner is adopted, the piezoelectric sheets 41 to 44 restore their original shape to increase the volume of the pressure chamber 10 as compared with the original volume, i.e., as compared with the volume obtained in a state where the both electrodes are set at different potentials, at the timing when the individual electrode 35 is set at the same potential as that of the common electrode 34. At this time, ink is fed from the manifold channels 5M, 5Y, 5C, and 5K into the pressure chamber 10. Thereafter, at the timing when the individual electrode 35 is reset at the potential different from that of the common electrode 34, the piezoelectric sheets 41 to 44 deform into a convex shape toward the pressure chamber 10 whose volume is thereby reduced to raise pressure on ink contained in the pressure chamber 10 so that ink is ejected through the nozzle 8. The ink-jet head 1 ejects ink from the nozzles 8 while traveling in the main scanning direction, and in this manner prints a desired image on a paper that has been conveyed on along the sub scanning direction.

Next, a method for manufacturing the ink-jet head 1 will be described with reference to FIGS. 8 to 11. In this embodiment, the passage unit 4 and the actuator unit 21 are prepared separately, and then they are assembled later. Manufacturing of the passage unit (step S1) and manufacturing of the actuator unit (steps S2 and S3) are independent processes, any one of which may precede the other or alternatively both of which may be performed coincidently.

In a step S1, the passage unit 4 is manufactured. To be more specific, each of the nine plates 22 to 30 constituting the passage unit 4 is subjected to etching process using a mask of patterned photoresist, so that openings as shown in FIG. 6 are formed in the respective plates 22 to 30. Then, the nine plates 22 to 30 are positioned to one another to form the individual ink passages 7, and put in layers with an epoxy-base thermosetting adhesive, and then heated under pressure up to a temperature higher than a curing temperature of the thermosetting adhesive. The thermosetting adhesive is thereby cured and the nine plates 22 to 30 are fixed to one another. Thus, the passage unit 4 as shown in FIG. 6 is obtained.

In order to manufacture the actuator unit 21, in a step 2, four green sheets made of piezoelectric ceramics are prepared. Preparation of the green sheets covers in advance an estimated amount of contraction that may be caused by sintering. On one of the green sheets, a conductive paste is screen-printed in a pattern of the common electrode 34. Then, the green sheets are positioned and put in layers using a jig, such that the green sheet having the conductive paste formed thereon is disposed under one green sheet having no conductive paste, and the two green sheets having no conductive paste are disposed under the aforesaid green sheet having the conductive paste, to thereby form a layered body.

In a step S3, the layered body obtained in the step S2 is degreased as is done on known ceramics as well, and then sintered at a predetermined temperature. Thus, the four green sheets get ready as the piezoelectric sheets 41 to 44 and the conductive paste gets ready as the common electrode 34. Subsequently, on the uppermost piezoelectric sheets 41, a conductive paste is screen-printed in a pattern of the individual electrodes 35. The layered body is again subjected to a heat treatment in order to sinter the conductive paste, so that the individual electrodes 35 are formed on the piezoelectric sheet 41. Thereafter, gold including glass frits is printed on the individual electrodes 35, thereby forming the lands 36.

In a modification, it is also possible that the passage unit 4 is heat-bonded to an actuator unit having no individual electrode 35 and no land 36 (which is herein referred to as the "actuator unit" for convenience of explanation), and then a conductive paste is screen-printed in a pattern of the individual electrodes 35 on the actuator unit, followed by a heat treatment to form the individual electrodes 35. Alternatively, it is also possible that a conductive paste is screen-printed in a pattern of the individual electrodes 35 on a green sheet, under which subsequently disposed is a green sheet having a conductive paste printed thereon in a pattern of the common electrode 34, under which further disposed are two green sheets having no conductive paste, thereby forming a layered body which is then subjected to sintering.

The actuator unit 21 as shown in FIG. 7 is manufactured through the steps 2 and 3.

In a step 4, next, an epoxy-base thermosetting adhesive having a curing temperature of approximately 80 degrees C. is applied using a bar-coater to the upper face of the passage unit 4 thus manufactured in the step S1. The thermosetting adhesive is exemplified by a two-liquid mixing type.

In a step S5, next, the actuator unit 21 is put on the passage unit 4 with the thermosetting adhesive applied therebetween. At this time, each actuator unit 21 is positioned to the passage unit 4 such that their active portions may be opposed to the respective pressure chambers 10. They are positioned on the basis of positioning marks (not shown) that have in advance been provided in the passage unit 4 and the actuator unit 21 in the steps S1 to S3.

In a step S6, next, the passage unit 4 and the actuator unit 21 put in layers with the thermosetting adhesive are heated by a heater/pressurizer (not shown) up to no less than the setting temperature of the thermosetting adhesive.

In a step 7, then, the passage unit 4 and the actuator unit 21 are taken out of the heater/pressurizer, and left to be cooled.

Through the above-described steps S1 to S7, the head main body 70 including the passage unit 4 and the actuator unit 21 is manufactured.

Next, the FPC 50 is manufactured.

In a step S8, first, a base film 49 having no through hole 45 is prepared. A copper film is put on the whole of an upper face of the base film 49 with an adhesive, and then a photoresist having a pattern of the conductors 48 is formed on a surface of the copper film.

Next, in a step S9, the copper film on the base film 49 is subjected to an etching process to remove regions thereof other than their portions serving as the conductors 48. As a result, many conductors 48 having a predetermined pattern is provided on the upper face of the base film 49. This means that many conductors 48 each having, as shown in FIG. 7B, the circular joint 46 and the extended-out part 47 extended out from the joint 46 are provided on the base film 49.

Figure 10A:
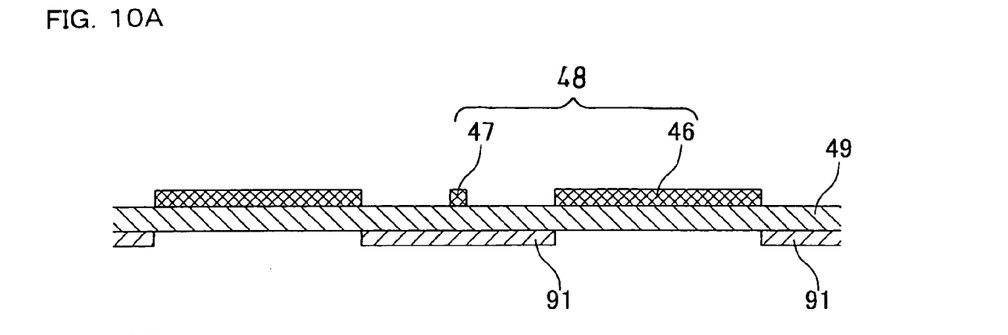
FIG. 10A shows a state where, in a manufacturing process of an FPC of the ink-jet head, a photoresist is formed on a lower face of a base film.
Figure 10B:
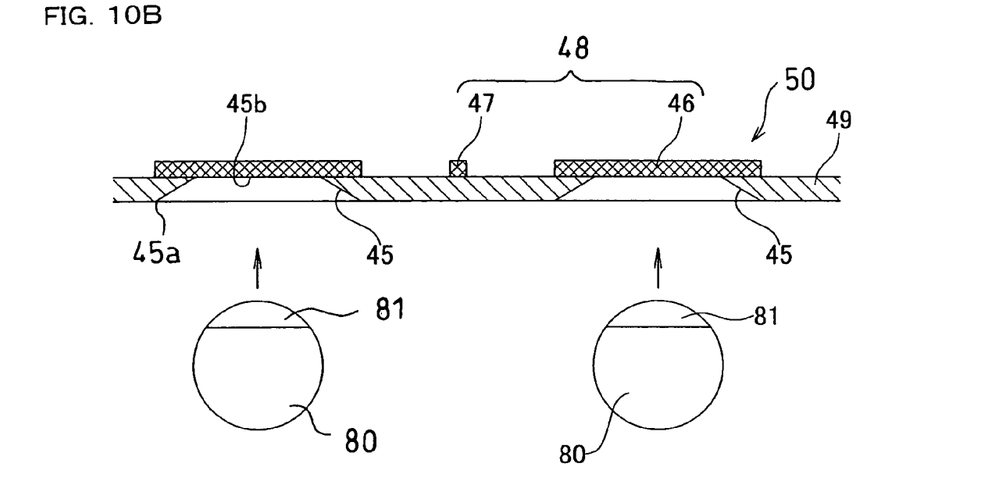
FIG. 10B shows a state where, in a manufacturing process of an FPC of the ink-jet head, solder balls are going to be mounted on lower faces of joints of conductors.

In a step S10, then, a photoresist 91 is provided in a region of the lower face of the base film 49 excluding regions corresponding to the through holes 45, as shown in FIG. 10A. In a step S11, the base film 49 is subjected to an etching process from its lower side to an extent of the thickness of the base film 49, so that tapered through holes 45 are formed in the base film 49 at positions corresponding to the joints 46 of the conductors 48, as shown in FIG. 10B. The opening 45b of the through hole 45 on the upper face of the base film 49 has an area smaller than a plane area of the joint 46. As a result of forming the through hole 45 in the base film 49, a portion of a lower face of the joint 46 confronting the opening 45b of the through hole 45 is exposed outside via the through hole 45.

Considering that a subsequent heat treatment makes the base film 49 expand isotropically, the through hole 45 is provided in such a manner that its center may be substantially aligned with the center of the land 36 of the individual electrode 35 when the land 36 is bonded to the joint 46 of the conductor 48.

Figure 11:
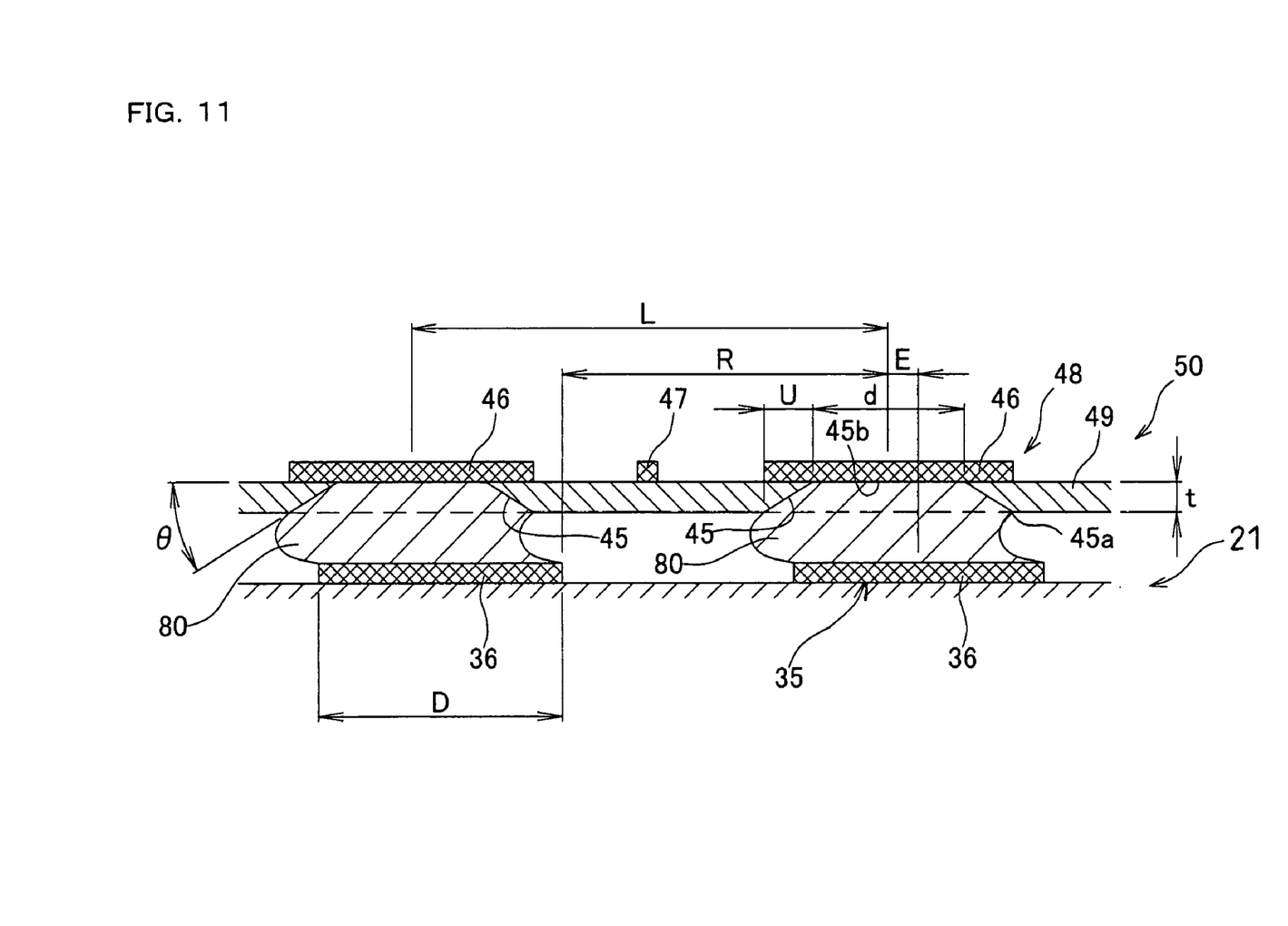
FIG. 11 is a sectional view showing the FPC being bonded onto an upper face of the actuator unit.

Here, referring to FIG. 11, the through hole 45 formed in the base film 49 in the step S11 will be described in detail.

In a state where the land 36 of the individual electrode 35 and the joint 46 of the conductor 48 are bonded to each other, the through hole 45 satisfies the following formulas (1) and (2):

$$R > d/2 + t/\tan\theta \quad (1)$$

$$R = L - D/2 - E \quad (2)$$

where d represents a diameter of the opening 45b of the through hole 45 on the upper face of the base film 49; $\theta$ represents an angle of inclination of a sidewall defining the through hole 45 with respect to the upper face of the base film 49; R represents a shortest distance from the center of the through hole 45 located righthand in FIG. 11 to a periphery of the land 36 located lefthand in FIG. 11; t represents a thickness of the base film 49; L represents a distance between the centers of neighboring through holes 45; D represents a diameter of the land 36; and E represents an extent of deviation of the center of the through hole 45 from the center of the corresponding land 36, which occurs in the step of bonding the land 36 of the individual electrode 35 to the joint 46 of the conductor 48.

When the formula (1) is transformed into a formula beginning with a solution of the thickness t of the base film 49, the following formula (1a) is given. When values d, $\theta$, and R that determine a shape of the through hole 45 in a designing stage are substituted for the formula (1a), a range of the thickness t of the base film 49 is given.

$$t < (R - d/2) \times \tan\theta \quad (1a)$$

Assuming that, for example, the distance L between the centers of neighboring through holes 45 is 0.6 mm, that the diameter d of the opening 45b is 0.3 mm, that the angle of inclination $\theta$ is 21 degrees, that the diameter D of the land 36 is 0.3 mm, and that the extent E of deviation is 0.2 mm; these values are substituted for the corresponding parts of the formula (2) to calculate the distance R. In this case, the distance R is 0.25 mm {=0.6−(0.3/2)−0.2}. Then, the obtained value of the distance R, the value of the diameter d of the opening 45b, and the value of the angle of inclination $\theta$ are substituted for the corresponding parts of the formula (1a), to calculate the range of the thickness t of the base film 49. In this case, the range of the thickness t of the base film 49 is approximately no more than 0.038 mm {=(0.25−0.3/2)×tan 21 degrees}. Therefore, when a through hole 45 whose opening 45b has a diameter of 0.3 mm and whose angle of inclination $\theta$ is 21 degrees is formed in the base film 49, a later-detailed effect that a short circuit is prevented can be obtained by setting the thickness t of the base film at 0.038 mm or less.

Then, in a step S12, a solder ball 80 to which a silane coupling agent 81 has been applied as shown in FIG. 10B is attached, from a lower side of the base film 49 and with the silane coupling agent 81, to the lower face of the joint 46 that is exposed outside via the through hole 45. In this embodiment, the solder ball 80 is attached to the joint 46 with the silane-coupling agent 81. However, other known methods may be adopted in order to attach the solder to the joint 46. For example, it is also possible to print a solder on the lower face of the joint 46.

Figure 10C:
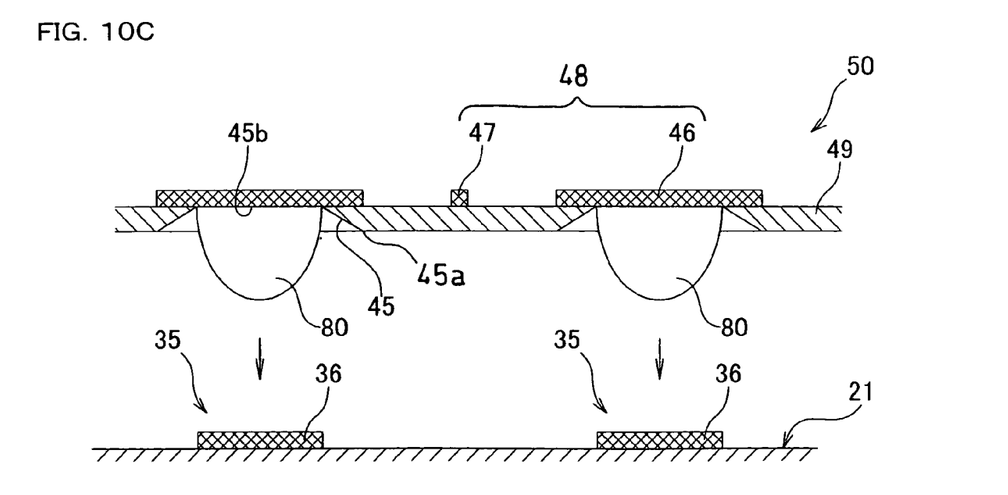
FIG. 10C shows a state where the joints of the conductors are going to be bonded, via the solder balls, to lands of individual electrodes.

In a step S13, next, the solder ball 80 assembled to the base film 49 is softened by being heated with infrared radiation or laser, etc., at a temperature higher than a melting point of the solder ball 80, thus smoothing and spreading the solder throughout a region of the lower face of the joint 46 corresponding the opening 45b of the through hole 45 as shown in FIG. 10C. Then, the softened solder ball 80 is once cooled to be solidified (reflow step). In a state where the solder ball 80 is once solidified, an extended-out part 47 of each conductor 48 is electrically connected to the driver IC 75, thereby completing the manufacturing of the FPC 50.

In this embodiment, in the step S12, the solder ball 80 is attached to the joint 46 from the lower side of the base film 49. However, it is also possible that the base film 49 having the through hole 45 is turned upside down and then the solder ball 80 is attached to the joint 46 from the upper side of the base film 49.

The steps S8 to S13 for manufacturing the FPC may be coincident with the steps S1 to S7 for manufacturing the head main body 70, or alternatively the steps for manufacturing the head main body 70 may precede the steps S1 to S7.

In a step S14, then, the land 36 of the individual electrode 35 and the joint 46 of the conductor 48 are bonded to each other. More specifically, as shown in FIG. 10C, the FPC 50 and the actuator 21 are positioned to each other such that the center of the through hole 45 may be substantially aligned with the center of the land 36 of the individual electrode 35. Then, the FPC 50 and the actuator 21 are laminated and subjected to a heat treatment again for melting the solder ball 80. Thereby, the land 36 of the individual electrode 35 and the joint 46 of the conductor 48 are bonded through the melted solder ball 80, as shown in FIG. 11.

Thereafter, a protective plate 51 (see FIGS. 2 and 3) is put on the FPC 50. Then, the head main body 70, the reinforcement plate 78, and the ink tank 71 are positioned and fixed to one another in such a manner that the ink outlet port 3a (see FIG. 2) of the ink tank 71, the through hole 78a (see FIG. 3) of the reinforcement plate 78, and the ink supply port 4a (see FIG. 4) of the passage unit 4 may communicate with one another. These are subsequently housed in the holder 72 and fixed. The elastic member 74, the driver IC 75, and the heat sink 76 are further provided, then completing the ink-jet head 1.

According to the above-described method for manufacturing the ink-jet head 1, since the through hole 45 formed in the base film 49 of the FPC 50 satisfies the aforesaid formula (1), the solder ball 80 disposed within the through hole 45 to bond the land 36 of the individual electrode 35 to the joint 46 of the conductor 48 can effectively be prevented from adhering to a uncorresponding land 36, e.g., to a land 36 neighboring the corresponding land 36, and in addition contact between the solder balls 80 can also be prevented effectively. More specifically, there arise considerably lowered possibilities that the righthand solder ball 80 in FIG. 11 may adhere to the lefthand land 36 in FIG. 11 and that the righthand and lefthand solder balls 80 in FIG. 11 come in contact with each other. Thus, a short circuit between the individual electrodes 35 can effectively be prevented, for the following reason.

By satisfying the formula (1), when the angle of inclination θ is large, the diameter of the opening 45*a* on the lower face of the base film 49 becomes relatively small, and therefore a base film 49 having a relatively large thickness t can be employed. When the angle of inclination θ is small, on the other hand, the diameter of the opening 45*a* on the lower face of the base film 49 becomes relatively large, and therefore a base film 49 having a relatively small thickness t should be employed. When the diameter d of the opening 45*b* of the through hole 45 on the upper face of the base film 49 is small, a base film 49 having a relatively large thickness t can be employed. However, when the diameter d is large, a base film 49 having a relatively small thickness t should be employed.

The thickness t of the base film 49 and values R, d, and θ which determine a shape of the through hole 45 are defined by the aforesaid formula (1). As a result, the opening 45*a* of the through hole 45 on the lower face of the base film 49 gets relatively away from a land 36 neighboring its corresponding land 36. This can provide the above-mentioned effect that a short circuit between the individual electrodes 35 is prevented.

This effect also works in the ink-jet head 1 in which, as in this embodiment, the through holes 45 are formed at a high density to realize a high-resolution printing. In other words, by adopting the above-described manufacturing method, the ink-jet head 1 capable of a high-resolution printing can be well manufactured while relieving the problem of a short circuit.

Further, the formula (2) as well as the formula (1) is satisfied in this embodiment. The formula (2) includes the extent E of deviation of the center of the through hole 45 from the center of the corresponding land 36, which occurs in the step of bonding the land 36 of the individual electrode 35 to the joint 46 of the conductor 48. Therefore, the above-mentioned effect that a short circuit is prevented can be obtained even if, in the step of bonding the joint 46 to the land 36, the center of the through hole 45 is deviated from the center of the corresponding land 36.

In this embodiment, as shown in FIG. 7B, the conductors 48 and the individual electrodes 35 are formed in a matrix on the upper face of the base film 49 and the upper face of the actuator unit 21, respectively. Since they are formed a matrix, they can be arranged at a high density. Accordingly, the pressure chambers 10 that are arranged in correspondence with the individual electrodes 35 and the nozzles 8 that communicate with the pressure chambers 10 can also be formed at a high density. Therefore, the ink-jet head 1 capable of a high-resolution printing can more efficiently be manufactured.

The above-described embodiment has shown definitions for a configuration of the FPC 50 and for positional relationships among the members with respect to the land 36 and the joint 46 which are electrically connected with each other. However, definitions can be made with respect to elements which should be insulated from each other, as will be described below.

In this embodiment, as shown in FIG. 7B, the individual electrodes 35 and the pressure chambers 10 are arranged at a high density in order to realize a high-resolution printing. In the vicinity of the land 36 of each individual electrode 35 arranged in a matrix, a main electrode region 35*a* of another neighboring individual electrode 35 is located. When, in such a state, the land 36 and the joint 46 are bonded to each other through the solder ball 80, the solder ball 80 may, at a strong possibility, come in contact with a main electrode region 35*a* of another individual electrode 35 neighboring the aforesaid land 36. Thus, a short circuit between the individual electrodes 35 can be easily caused.

In this case, the thickness t of the base film 49 and values R, d, and θ which determine a shape of the through hole 45 are defined by the aforesaid formula (1). Here, R represents "a shortest distance from the center of a certain through hole 45 to a periphery of a main electrode region 35*a* of an individual electrode 35 that neighbors an individual electrode corresponding to the aforesaid certain through hole 45". As a result, the opening 45*a* of the through hole 45 on the lower face of the base film 49 gets relatively away from the main electrode region 35*a* of another individual electrode 35 that neighbors the land 36 corresponding to the aforesaid certain through hole 45. Thereby, the land 36 can surely be bonded to the joint 46 of the conductor 48 while relieving the above-mentioned problem of a short circuit between the individual electrodes 35 which is caused by contact between the solder ball 80 and the main electrode region 35*a* of another individual electrode 35 neighboring the land 36.

In this case, the formula (2) is to be satisfied under the following conditions. That is, D represents "a length of a part of a line passing through the center of a certain through hole 45 and through a point which locates in a main electrode region 35*a* of an individual electrode 35 neighboring an individual electrode corresponding to the aforesaid certain through hole 45 and is closest to the center where the line overlaps with the aforesaid main electrode region 35*a*. L represents "a distance between the center of a land 36 bonded to a joint 46 and the center of the aforesaid overlapping part of the line". E represents "an extent of deviation of the center of a through hole 45 from the center of a corresponding land 36, which occurs in the step of bonding a land 36 of an individual electrode 35 to a joint 46 of a conductor 48", which is the same as in the above-described embodiment.

In the above-described embodiment, the method for manufacturing the ink-jet head 1 is adapted to satisfy the formula (2) as well as the formula (1). However, assuming that the center of the joint 46 is aligned with the center of the land 36, i.e., no deviation occurs therebetween, which is an ideal case, the formula (2) may not include the extent E of deviation.

The use of an ink-jet head manufactured through the method according to the present invention is not limited to printers, but it is also applicable to ink-jet type facsimiles or copying machines.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A method for manufacturing an ink-jet head comprising the steps of:

forming a plurality of conductors on one face of a substrate of the ink-jet head;

forming, in the substrate, a plurality of through holes corresponding to the plurality of conductors, respectively, and each of the through holes having a diameter increasing from the one face of the substrate toward an other face of the substrate that is parallel to the one face;

attaching, from the other face, metal balls to the conductors that are exposed outside via the through holes; and heating and thus melting the metal balls, so that the conductors are bonded, through the melted balls, to a plurality of electrodes, respectively, that are formed in correspondence with the respective conductors along a plane parallel to the one face of the substrate, wherein, in the step of forming the plurality of through holes, each of the through holes are formed in such a manner as to satisfy Equation (1) below:

$$R > d/2 + t/\tan\theta$$

where:

d represents a width of an opening of the through hole on the one face;

θ represents an angle of inclination of a sidewall defining the through hole with respect to the one face;

R represents a shortest distance from a center of the through hole to a periphery of one of the electrodes that neighbors another one of the electrodes corresponding to the through hole; and t represents a thickness of the substrate;

wherein d, θ, R, and t are selected to satisfy Equation (1).

2. The method according to claim 1, which satisfies Equation (2) below:

$$R = L - D/2 - E$$

where:

L represents a distance between the center of the through hole and a center of another one of the through holes;

D represents a width of the electrode; and

E represents an extent of deviation of the center of the through hole from a center of the electrode corresponding to the through hole, which occurs in the step of heating where the electrodes and the conductors are bonded to each other;

wherein R, L, D, and E are selected to satisfy Equation (2).

3. The method according to claim 1, wherein the conductors and the electrodes are formed in a matrix on the one face of the substrate and on the plane, respectively.

* * * * *